United States Patent [19]
Herlihy et al.

[11] Patent Number: 5,530,354
[45] Date of Patent: Jun. 25, 1996

[54] NON-MONOTONIC GRADIENT COIL SYSTEM FOR MAGNETIC RESONANCE IMAGING

[75] Inventors: David J. Herlihy; Amy Herlihy, both of New Berlin, Wis.

[73] Assignee: Medical Advances, Inc., Milwaukee, Wis.

[21] Appl. No.: 282,992

[22] Filed: Jul. 29, 1994

[51] Int. Cl.⁶ ............................................. G01R 33/20
[52] U.S. Cl. .................................. 324/318; 324/309
[58] Field of Search ................................ 324/300, 307, 324/309, 312, 314, 318, 322; 128/653.5

[56] References Cited

U.S. PATENT DOCUMENTS

| | | | |
|---|---|---|---|
| 4,651,098 | 3/1987 | Yamada et al. | 324/309 |
| 4,825,162 | 4/1989 | Roemer et al. | 324/318 |
| 5,122,748 | 6/1992 | Oh et al. | 324/309 |
| 5,177,442 | 1/1993 | Roemer | 324/322 |
| 5,252,922 | 10/1993 | Larson, III | 324/309 |
| 5,386,190 | 1/1995 | Takeuchi et al. | 324/309 |

*Primary Examiner*—Walter E. Snow
*Assistant Examiner*—Raymond Y. Mah
*Attorney, Agent, or Firm*—Quarles & Brady

[57] ABSTRACT

A local gradient coil for use in magnetic resonance imaging provides a system of windings that produces a non-monotonic gradient field. The non-monotonic field provides spatially separate regions experiencing similar gradients and thus does not uniquely identify spatially separate spins. Multiple receiving coils positioned near each of the regions of similar gradient field strength are used to receive the multiple NMR signals. A determination of the sensitivity of these receiving coils may be used to determine the contribution from each spin to the signal produced by each coil thus allowing the superimposed signals to be separated.

9 Claims, 2 Drawing Sheets

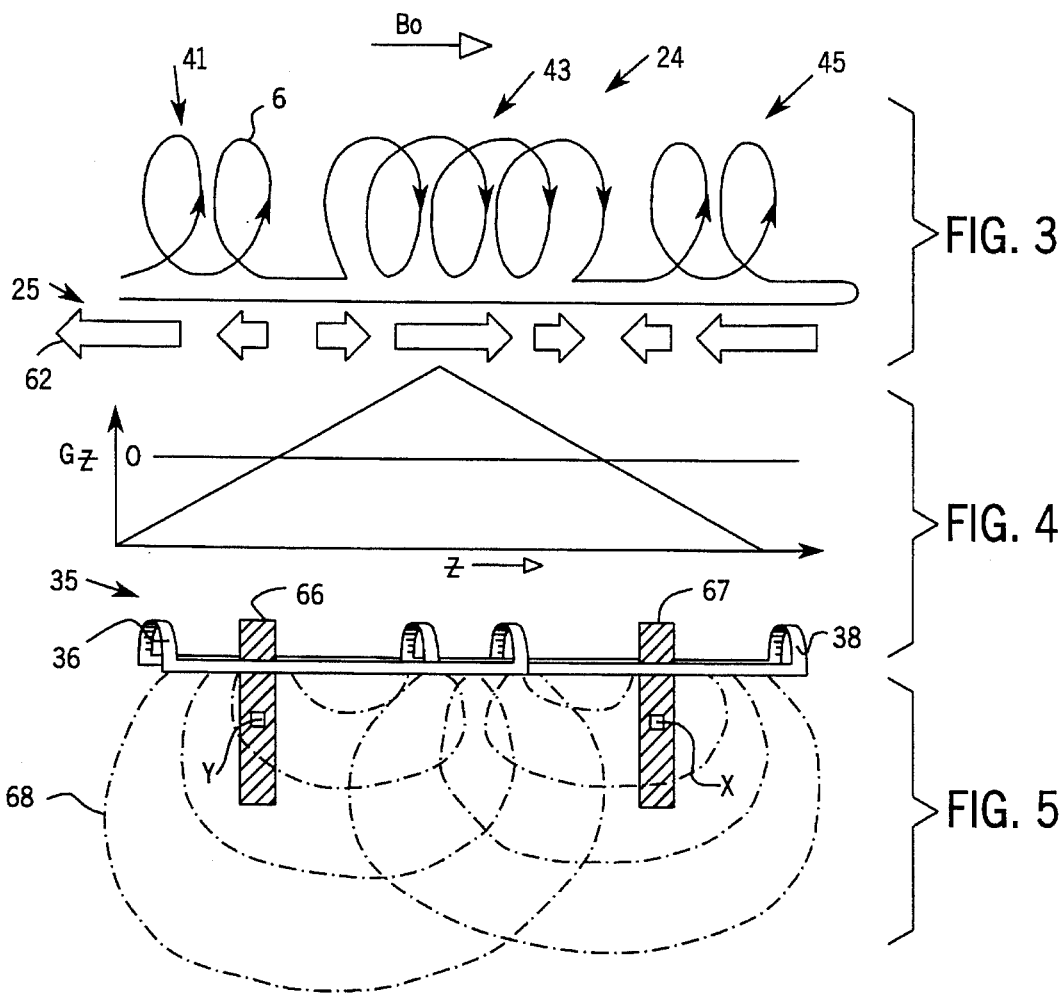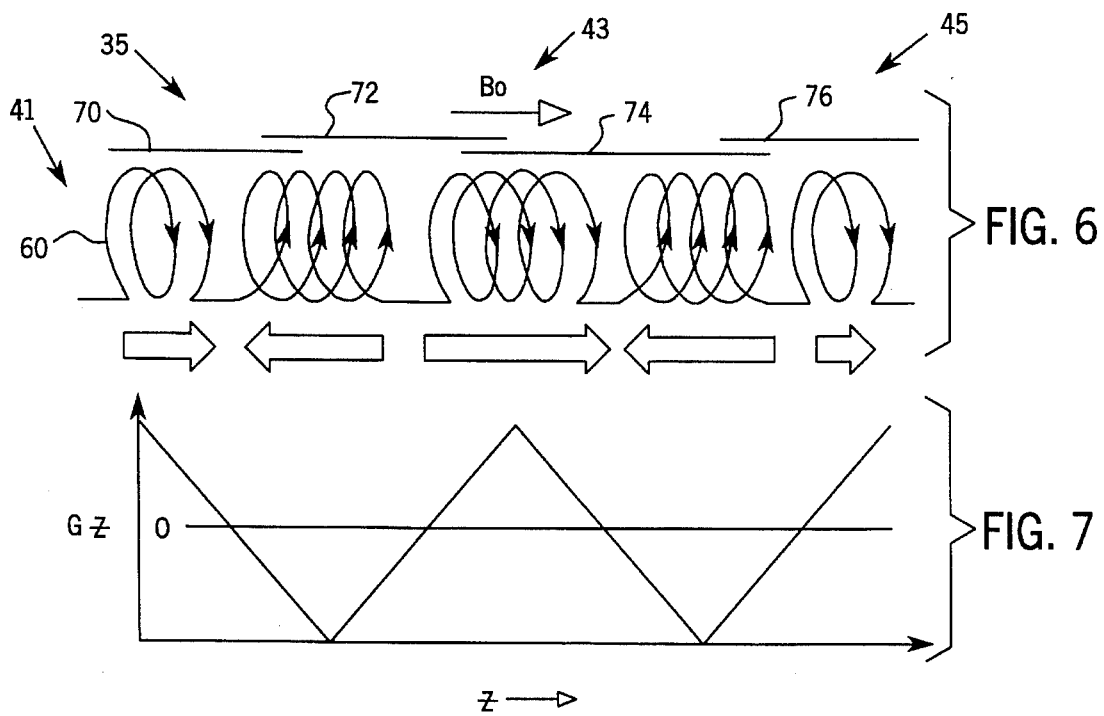

NON-MONOTONIC GRADIENT COIL SYSTEM FOR MAGNETIC RESONANCE IMAGING

BACKGROUND OF THE INVENTION

The field of the invention is magnetic resonance imaging (MRI) and, in particular, a gradient coil for an MRI system and image reconstruction method for use with that gradient coil.

When human tissue is subjected to a polarizing magnetic field $B_0$, the individual magnetic moments of the spins in the tissue attempt to align with this polarizing field but precess about it at a Larmor frequency dependent principally on the magnetic field strength. The precession produces a resonance (NMR) signal that may be detected and used to generate an image by imparting a spatially dependent phase and frequency to the spins through the use of superimposed and orthogonal gradient fields ($G_x$, $G_y$ and $G_z$).

In one common imaging sequence, gradient fields are employed, individually or together, to first select a slice volume in which the spins are coherent by generating a functional "select" gradient in conjunction with an RF excitation. Second, by means of a functional "frequency" gradient, the frequency of the spins within this slice is changed according to their location along the select gradient. Finally, along an axis orthogonal to that of the select and frequency gradients, a progressively increasing functional "phase" gradient is applied to vary the phase of the spins according to their location along that axis.

The time sequence of nuclear magnetic resonance (NMR) signals for a set of different phase encodings producing an array of data that when operated on by a two-dimensional Fourier transform yields an image of a slice through the patient. A basic overview of MRI image reconstruction is contained in the book *"Magnetic Resonance Imaging, Principles and Applications"* by D. N. Kean and M. A. Smith hereby incorporated by reference.

It is desirable to be able to produce gradient fields with fast switching ("slew rate") and with high spatial gradients ("steepness"). Higher gradient slew rate generally allows faster acquisitions of the necessary MRI signals. Higher gradient steepness increases the spatial resolution of the imaging process permitting smaller voxels of a patient to be discerned. Higher gradient amplitudes (accompanying greater gradient steepness) can also reduce the time required to obtain an MRI signal.

Generally, both the slew rate and amplitude of the gradients are limited, first, by the maximum voltage and current of the gradient amplifiers powering the gradient coils. Changing from a greater maximum to minimum voltage in a given time increases the current through the inductance of the gradient coil at a faster rate increasing the slew rate whereas higher currents produce generally higher amplitude in gradient fields which, for the fixed length of the gradient coil, produces a steeper gradient.

Slew rate and steepness are also limited for physiological reasons: too rapid changes in the gradient fields can induce a tingling sensation in the patient and cause involuntary muscle contraction. For this reason, the FDA has placed limits on the rate of change of the magnetic field to which a patient may be exposed in a magnetic resonance imaging machine. Given the practical requirements of short imaging time, a limitation in the rate of change of the gradient magnetic field effectively limits the maximum gradient steepness that can be obtained with a given gradient coil.

SUMMARY OF THE INVENTION

The present invention provides improved gradient steepness in a gradient coil satisfying the multiple constraints of imaging acquisition time, peak slew rates and FDA rate of change limits. The invention breaks the gradient coil into separate sections along the length of the gradient so that the slope of the gradient changes direction one or more times over that length. The result of this division is that the peak gradient magnetic field at any point is reduced, limiting the maximum rate of change, for any given time, of the magnetic field as it changes.

One result of this non-monotonic gradient is that separate volumes of the patient will experience the same value of magnetic field. For example, if the non-monotonic gradient is used for slice selection, more than one slice will be selected. The NMR signals from these multiple slices will join to produce an image that superimposes these separate volumes of the patient.

For this reason, separate receiving coils are arrayed along the length of the gradient coil, each being sensitive primarily to the NMR signals from volumes associated with different portions of the gradient. The multiple signals from these coils may be used to separate the NMR signals from the volumes receiving the same gradient value.

Specifically, the gradient coil of the present invention includes a coil form adjacent to an imaging volume having N spatially separate regions disposed along a gradient axis. Gradient coils are attached to the coil form and have windings disposed to create a non-monotonic gradient magnetic field along the axis, the non-monotonic magnetic field having identical gradient strength within the N separate regions of the imaging volume. Corresponding receiver coils are arranged adjacent to imaging volume to produce N NMR signals associated with the N spatially separate regions.

Thus, it is one object of the invention to produce a rapidly switched gradient field having high steepness without violating limits on the rate of change of magnetic fields to which the patient is exposed. By breaking the gradient into several smaller portions, the maximum rate of change of the magnetic field is reduced.

The sensitivity of each of the receiver coils may be determined and the contribution, in each NMR signal, from the spins of each spatially separate region may be ascertained. Each NMR signal may have removed from it the contributions from spins in each of the other spatially separate regions to produce an independent NMR signal substantially of only the spins only in a single region. Each of these independent NMR signals may be used to reconstruct an image of the associated spatial region and those images combined to produce an image of the entire imaging volume.

Thus, it is another object of the invention to provide a means of precisely isolating the NMR signals from the different regions experiencing different gradients, thus permitting a non-monotonic gradient field to be used.

The foregoing and other objects and advantages of the invention will appear from the following description. In the description, reference is made to the accompanying drawings which form a part hereof and in which there is shown by way of illustration, a preferred embodiment of the invention. Such embodiment does not necessarily represent the full scope of the invention, however, and reference must

BRIEF DESCRIPTION OF THE DRAWINGS

FIG. 3 is a pictorial representation of the windings of the gradient coil of FIGS. 1 and 2 showing the direction of current flow about the coil form and the direction and magnitude of the generated magnetic field;

FIG. 4 is a plot of gradient strength versus z-axis position for the gradient coil as aligned with the representation of FIG. 3 showing its non-monotonicity resulting in identical gradient fields for two spatially separated regions;

FIG. 5 is a simplified view of the RF receiving coils of the gradient coil of FIG. 2 showing the sensitivities of different coils to the two spatially separated regions;

FIG. 6 is a figure similar to that of FIG. 3 showing an alternative embodiment in which a W-shaped non-monotonicity is formed having identical gradient fields in four spatially separated regions;

FIG. 7 is a figure similar to that of FIG. 4 for the coil of FIG. 6.

DETAILED DESCRIPTION OF THE PREFERRED EMBODIMENT

Figure 1:
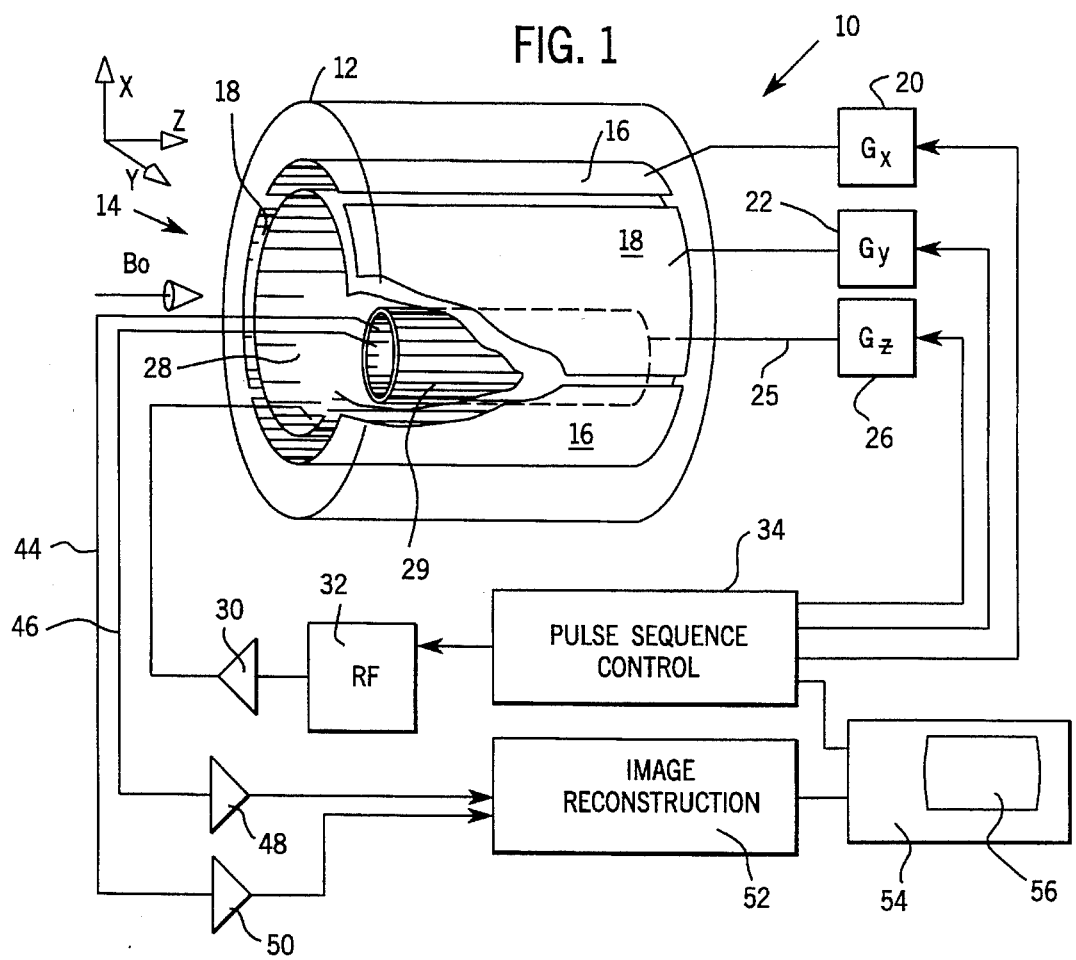
FIG. 1 is a schematic block diagram of an NMR machine showing placement of the gradient coil of the present invention for use in generating a z-axis gradient.

Referring to FIG. 1, a magnetic resonance imaging system 10 includes generally a cylindrical magnet 12 having a bore 14 for receiving a patient (not shown), the magnet 12 producing a substantially uniform magnetic field $B_0$ along a z-axis parallel to the axis of the cylindrical bore 14. The cylindrical magnet 12 may be constructed according to well known techniques and in one commercially available form includes multiple annular superconducting coils arranged in a Helmholtz configuration.

Concentrically surrounding the bore 14 are x-gradient coils 16 opposed vertically about the center of the bore and y-gradient coils 18 opposed horizontally about the center of the coil. The gradient coils 16 and 18, shown schematically, in FIG. 1 may be of the well known "fingerprint" style and serve to produce magnetic fields generally aligned with the $B_0$ field but which add to or subtract from the $B_0$ field as one moves respectively along the x or y axis thus producing the desired gradient in the $B_0$ field.

X-gradient coils 16 are attached to an x-gradient amplifier 20 whereas y-gradient coils 18 are attached to a y-gradient amplifier 22.

In the present invention, the z-axis gradient is provided by a separate cylindrical z-axis gradient coil 24 positioned within the bore 14, the axis of its cylindrical shape aligned with the $B_0$ axis, for receiving a patient's arm or leg, as will be described further below. The z-axis gradient coil 24 is connected to a z-axis gradient amplifier $G_z$ in lieu of that amplifier's normal connection to a larger z-axis gradient coil (not shown) associated with the other gradient coils.

Also concentrically positioned about the axis of the bore 14 is an RF excitation coil 28 which receives an RF excitation pulse from amplifier 30 in turn connected to RF pulse generator 32. The RF pulse so produced serves to excite the spins of a patient in the bore 14 into resonance as has been described.

The RF pulse generator 32 and the gradient amplifiers 20, 22 and 26 receive signals from a pulse sequence control circuit 34 which provides the combination of RF excitation pulse and gradient pulse sequence necessary for an MRI imaging sequence. Such pulse sequences are well known in the art and may include, for example, the so-called "spin echo" or "echo planar" imaging sequence.

Figure 2:
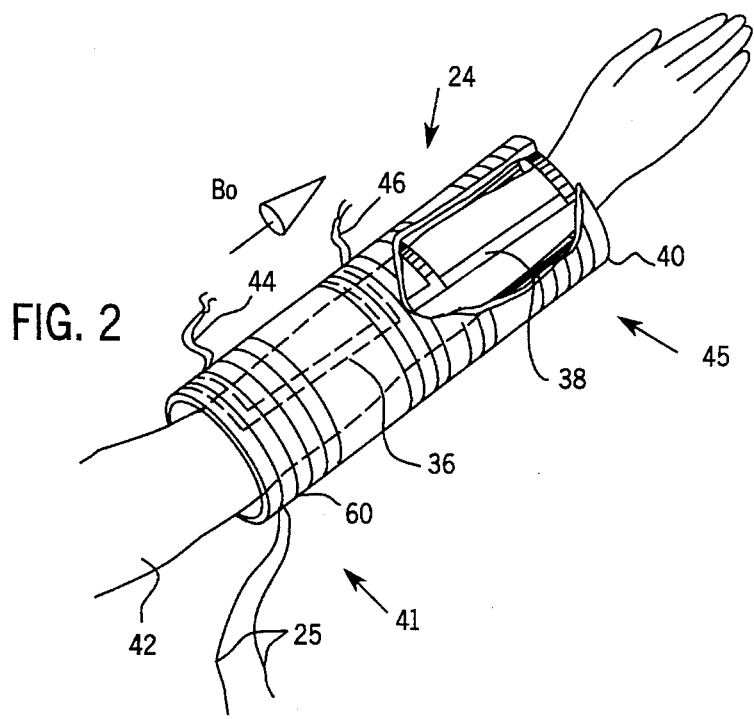
FIG. 2 is a perspective view of the gradient coil of FIG. 1 as positioned about the arm of a patient.

Referring now to FIGS. 1 and 2, the z-axis gradient coil 24 includes a tubular coil form 40, sized to receive substantially the entire leg or arm of a patient 42. Coil form 40 may be any rigid nonconductive material with a low dielectric constant such as PVC.

Two surface coils 36 and 38, each being overlapping rectangular loops, extend over approximately 180° of the upper circumference of the coil form 40, and are affixed to the inner surface of the tubular coil form 40. The surface coils 36 and 38 have their axes of symmetry disposed radially through the form 40 to be sensitive to changes in an x-axis magnetic vector when the z-axis gradient coil 24 is positioned within the bore 14 about an arm of a patient 42.

The surface coils 36 and 38 are tuned to the resonant frequency of the spin of hydrogen nuclei in the given field $B_0$ by the use of series capacitances (not shown) as is well understood in the art. The general construction of a surface coil including a description of isolation circuitry for isolating the coil from the RF excitation pulse may be found in U.S. Pat. No. 5,166,618 issued Nov. 24, 1992, assigned to the same assignee as the present invention and hereby incorporated by reference.

As will be described further below, each coil 36 and 38 is predominantly sensitive to a different region of the volume enclosed by the coil form 40. Separate NMR signals received by the two coils 36 and 38 are transmitted over leads 44 and 46 which are received by separate amplifiers 48 and 50, respectively. Normally additional input amplifiers similar to 48 and 50 may be provided so that additional channels of NMR data may be collected, for example when four channel detection systems are employed.

The amplified NMR signals are in turn received by an image reconstruction circuit 52 within the MRI system, such as is well known in the art, which includes a general purpose computer that may perform general mathematical operations on the sampled and digitized values of the NMR signals and that reconstructs tomographic or other images of the patient's arm.

Programming and control of the pulse sequence control circuit 34 and the image reconstruction circuit 52 is provided through an operator console 54 such as is well known in the art. The operator console 54 includes a display 56 upon which the images of the reconstructed images of the patient may be displayed.

Referring now to FIGS. 2 and 3, wrapped about the outer surface of coil form 40, on the outside of the coil form 40 and hence over the coils 36 and 38, is a circumferentially wound conductor 60 serving to conduct the current needed to produce the desired z-axis gradient field. The winding of the conductor 60 generally spirals helically about the cylindrical axis of the form 40 from one end of the form 40 to the other. Generally, the wound conductor 60 is encapsulated in epoxy or the like to prevent movement of the conductor 60 under the forces caused by interaction between its windings.

The windings at the distal end 41 of the form, i.e., near the patient's hand when the z-axis gradient coil 24 is used over a patient's arm, are wound counterclockwise as viewed from the distal end 41. Toward the center 43 of the form 40, the windings reverse direction to pass helically in a clockwise direction and then at the proximal end 45 of the form 40 closest to the patient's shoulder, the windings again pass in a counterclockwise direction.

The two ends of the conductor 60 connect to leads 25 which in turn is connected to a gradient amplifier 26. When current is passed through the conductor 60 from distal to proximal end of the form 40, the magnetic field 62 produced by the windings at either end 41 and 45 of the coil form 40 are opposite in direction to the magnetic polarizing field $B_0$ whereas the magnetic field produced by the windings near the center 43 passing in a clockwise direction augment the polarizing magnetic field $B_0$.

Referring to FIG. 4, the changes in the direction that the conductor 60 wraps around the form 40 and changes the z-axis inter-winding spacing are selected so as to produce a gradient field whose intensity is piecewise linear as measured along the z-axis, but that varies non-monotonically, that is has both positive and negative slopes. As shown in FIG. 4, the gradient profile along the z-axis produced by the above described distal to proximal current flow, has the shape of a substantially inverted V with a maximum positive gradient along the z-axis near the center 43 of the form 40 and the maximum negative gradient near the ends 41 and 45 of the form 40.

Between the peak gradients at the center 43 of the form 40 and the ends 41 and 45 of the form 40, the gradient change is substantially linear. Each such region of linearity, comprising approximately ½ of the coil of FIGS. 3, 4, and 5, will be termed a region.

Referring now to FIG. 5 for each region, for any given gradient level, there exists within each region volume elements (voxels) X in the first region and Y in the second region which experience the same gradient field strength. Thus, for example, if the z-axis gradient coil 24 were used as a slice select coil during the RF excitation pulse, two slices 67 incorporating volume element X and 66 incorporating volume element Y would be excited into resonance. A single RF receiving coil sensitive to the entire region of the z-axis gradient coil 24 would thus fail to spatially differentiate between these two slices 66 and 67 and would produce an image showing the features of both slices both superimposed.

To avoid this situation, use is made of the fact that the sensitivities of the RF coils 36 and 38 are such that coil 38 is predominantly sensitive to spins within the first region incorporating volume element X and coil 36 is predominantly sensitive to the second region incorporating volume element Y. Thus, the failure of the non-monotonic gradient field produced by the z-axis gradient coil 24 to uniquely identify each volume element 64(*a*) and 64(*b*) is made up for by the use of multiple receiving coils 36 and 38.

Referring still to FIG. 5, generally each coil 36 and 38 will have a pattern of sensitivity indicated schematically by lines 68 of constant sensitivity. Regions further from the coils 36 or 38 have a decreased sensitivity indicated by the number of lines 68 one must cross passing from the center of the coils 36 and 38. The lines 68 indicating the spatial sensitivity of each coil 36 and 38 may be determined either through mathematical modeling or by empirical testing of the coil according to methods well known in the art.

Generally, and as is illustrated in FIG. 5, there will be overlap between the sensitivities of the coils 36 and 38. Only in a slice positioned exactly between the coils 36 and 38 and thus midway along coil form 40 along a plane normal to axis of the form 40 will the sensitivities of the two coils 36 and 38 be substantially the same. Here, the windings of the conductor 60 may be positioned so as to give this region a unique gradient strength greater than anywhere else along the coil form 40 and thus eliminating any ambiguity as to the locations of the spins contributing to the received signal. In short, the signal received from both of coils 36 and 38 may be simply added for this slice without degrading the reconstructed image.

In all other regions for any given voxel X or Y, the differences in the sensitivities of the coils may be exploited to differentiate between the NMR signals generated by spatially separate spins. In the simplest approach, the signal from each coil 36 and 38 may be used separately to reconstruct images of the different regions which may then be spliced together to create an image of the entire volume of the z-axis gradient coil 24.

Improved discrimination between regions may be obtained by making use of information on the spatial sensitivity of each of the coils 36 and 38. In this approach, each volume element X and Y at different x, y and z locations within the coil form 40 may be assigned a coefficient of sensitivity $\alpha$ or $\beta$ in relationship to either the coil 36 or 38. For example, for volume element X, the coefficient $\alpha$ for coil 38 will generally be much higher than the coefficient $\beta$ for coil 36 because volume element X is closer to coil 38. For two NMR signals received from coils 36 and 38 designated $NMR_1$ and $NMR_2$, the following will be true.

$$NMR_1 = \alpha_1 X + \alpha_2 Y \qquad (1)$$

$$NMR_2 = \beta_1 X + \beta_2 Y \qquad (2)$$

where $\alpha_1 \neq \alpha_2$ and $\beta_1 \neq \beta_2$ and X and Y indicate the NMR signal from the spins of voxel x and Y respectively.

These two equations (1) and (2) may be solved simultaneously to provide measurements X and Y without contributions from the spins of the other voxel. As a practical matter, this principle can be applied to an entire slice 66 or 67 by averaging the sensitivity of each coil 36 and 38 over the volume of the slice.

Thus, the use of two coils 36 and 38 together with knowledge of the coils sensitivity may be used to extract information unique to each of the two spatial regions.

Referring now to FIGS. 6 and 7 in an alternative but analogous embodiment, the gradient may be given a W shape having four separate regions in which the gradient is substantially linear but has alternatingly opposite slopes.

In particular, the windings of the embodiment of FIG. 6 proceed in a counterclockwise direction at either end 41 or 45 of the form 40 and at the center 43 of the form 40 (as viewed from the distal end 41 of the form 40), and proceed in a counterclockwise direction, between the ends 41 and 45 of the form and the center 43 of the form.

Here, four receiving coils 35 designated as 70, 72, 74 and 76 are required to provide independent coverage of the four separate gradient regions. Four equations similar to equations (1) and (2) above may be produced for each NMR signal received by the coils 35: $NMR_1$ through $NMR_4$, each signal being composed of combined NMR signals from four different regions experiencing similar gradient field strengths but having different weighting coefficients with respect to each coil 35. This system of equations may be solved providing the NMR signal from each region essentially isolated from the contributions of the other regions.

The above description has been that of a preferred embodiment of the present invention. It will occur to those that practice the art that many modifications may be made without departing from the spirit and scope of the invention.

For example, the non-monotonic gradient field may be produced by other coil configurations well known in the art such as fingerprint coil designs and the receiving coils may be of other designs such as quadrature, saddle or birdcage coils well known in the art. Clearly the invention is applicable not just to z-axis gradient fields but to any gradient field. In order to apprise the public of the various embodiments that may fall within the scope of the invention, the following claims are made.

We claim:

1. A method of magnetic resonance imaging of nuclear spins in a body in a polarizing magnetic field, comprising the steps of:

a) stimulating the spins with an RF excitation field;

b) applying at least one non-monotonic magnetic field having N spatially separate regions of identical gradient strength;

c) receiving NMR signals from the nuclear spins in the N regions with at least one receiver coil proximate to each of the N spatially separate regions and predominantly sensitive to spins only within the region to which it is proximate to produce N separate NMR signals; and d) combining the N separate NMR signals to produce an image.

2. The method of claim 1 wherein step (d) comprises:

(d1) determining the spatial sensitivity of each of the corresponding receiver coils;

(d2) determining from step (d1), the contribution in each NMR signal from the spins in each of the spatially separate regions;

(d3) removing from each separate NMR signal all contributions from the spins in each of the spatially separate regions but one to produce independent NMR signals substantially of spins only in a mingle region;

(d4) producing separate region images of each spatially separate region from the independent NMR signals; and (d5) combining the images to produce the image.

3. The method of claim 2 wherein the spatial sensitivity is determined by a mathematical model of the receiver coils.

4. The method of claim 2 wherein the spatial sensitivity is determined by an empirical measurement of the sensitivity of each coil.

5. The method of claim 1 wherein steps (a) and (b) are substantially simultaneous.

6. The method of claim 1 wherein the non-monotonic gradient magnetic field has a straight profile along the z-axis that is substantially "V" shaped and wherein N is two.

7. The method of claim 1 wherein the non-monotonic gradient magnetic field has a strength profile along the axis that is substantially "W" shaped and wherein N is four.

8. A gradient coil for use with magnetic resonance imaging comprising:

a coil form adjacent to an imaging volume having spatially separate regions disposed along an axis;

at least two gradient coils attached to the coil form having windings disposed to create at least a non-monotonic gradient magnetic field along the axis, the non-monotonic magnetic field having N spatially separate regions of identical gradient strength within the imaging volume; and corresponding receiving coils arranged adjacent to the imaging volume to produce N NMR signals associated with the N spatially separated regions.

9. The gradient coil of claim 8 wherein the coil form is a cylindrical tube and where the gradient coils are wound around the axis of the tube and wherein the receiving coils are wound around an axis perpendicular to the axis of the tube.

* * * * *

UNITED STATES PATENT AND TRADEMARK OFFICE
CERTIFICATE OF CORRECTION

PATENT NO. : 5,530,354
DATED : June 25, 1996
INVENTOR(S) : David J. Herlihy et al.

It is certified that error appears in the above-indentified patent and that said Letters Patent is hereby corrected as shown below:

Col. 6, line 33          "x and Y" should be
                         --X and Y--.

Col. 7, line 35          "only in a mingle" should be
                         --only in a single--.

Signed and Sealed this

Nineteenth Day of November, 1996

Attest:

BRUCE LEHMAN

Attesting Officer          Commissioner of Patents and Trademarks